(12) United States Patent
Zhu et al.

(10) Patent No.: US 10,700,147 B2
(45) Date of Patent: Jun. 30, 2020

(54) ARRAY SUBSTRATE, ORGANIC LIGHT EMITTING DISPLAY PANEL AND ORGANIC LIGHT EMITTING DISPLAY DEVICE

(71) Applicant: SHANGHAI TIANMA AM-OLED CO., LTD., Shanghai (CN)

(72) Inventors: Renyuan Zhu, Shanghai (CN); Yue Li, Shanghai (CN); Dongxu Xiang, Shanghai (CN); Yana Gao, Shanghai (CN)

(73) Assignee: SHANGHAI TIANMAN AM-OLED CO., LTD., Shanghai (CN)

( * ) Notice: Subject to any disclaimer, the term of this patent is extended or adjusted under 35 U.S.C. 154(b) by 76 days.

(21) Appl. No.: 15/944,465

(22) Filed: Apr. 3, 2018

(65) Prior Publication Data

US 2018/0226460 A1    Aug. 9, 2018

(30) Foreign Application Priority Data

Nov. 22, 2017   (CN) .......................... 2017 1 1172127

(51) Int. Cl.
*H01L 27/32* (2006.01)
*H01L 51/52* (2006.01)
*G09G 3/3208* (2016.01)

(52) U.S. Cl.
CPC ....... *H01L 27/3246* (2013.01); *G09G 3/3208* (2013.01); *H01L 27/3276* (2013.01); *H01L 27/3279* (2013.01); *H01L 51/5206* (2013.01); *H01L 51/5221* (2013.01); *G09G 2300/0426* (2013.01); *G09G 2320/0223* (2013.01)

(58) Field of Classification Search
CPC ............. H01L 27/3246; H01L 51/5206; H01L 27/3276; H01L 51/5221; H01L 27/3279; H01L 27/32; H01L 51/52; G09G 3/3208; G09G 2300/0426; G09G 2320/0223
USPC .......................................................... 257/79
See application file for complete search history.

(56) References Cited

U.S. PATENT DOCUMENTS

| | | | |
|---|---|---|---|
| 9,287,329 B1* | 3/2016 | Lee ..................... | H01L 51/0097 |
| 2005/0041002 A1* | 2/2005 | Takahara ............. | G09G 3/3241 345/76 |
| 2006/0017671 A1* | 1/2006 | Yamada ............... | G09G 3/3233 345/77 |
| 2007/0176563 A1* | 8/2007 | Kim .................... | H01L 51/5246 315/169.3 |

(Continued)

FOREIGN PATENT DOCUMENTS

| CN | 1967866 A | 5/2007 |
|---|---|---|
| CN | 103296033 A | 9/2013 |

*Primary Examiner* — Alexander O Williams
(74) *Attorney, Agent, or Firm* — Alston & Bird LLP

(57) ABSTRACT

An array substrate, an organic light emitting display panel and an organic light emitting display device are provided. The array substrate includes a base substrate and pixel units; a first electrode wire and a second electrode wire formed at a side of the base substrate, the first electrode wire being configured to provide a first supply voltage signal for the anode layer, the second electrode wire being configured to provide a second supply voltage signal for the cathode layer; a first metal wire and a second metal wire formed in the non-display region and surrounding the display region. The first metal wire is electrically connected to the first electrode wire, and the second metal wire is electrically connected to the second electrode wire.

17 Claims, 6 Drawing Sheets

(56) References Cited

U.S. PATENT DOCUMENTS

| | | | |
|---|---|---|---|
| 2008/0030491 A1* | 2/2008 | Kim | G06F 1/3203 345/207 |
| 2008/0062373 A1* | 3/2008 | Kim | G02F 1/1345 349/151 |
| 2010/0141570 A1* | 6/2010 | Horiuchi | G09G 3/3611 345/100 |
| 2016/0013436 A1* | 1/2016 | Im | H01L 51/5206 257/40 |
| 2016/0111485 A1* | 4/2016 | Chida | H01L 27/322 257/40 |
| 2016/0179259 A1* | 6/2016 | Watanabe | G06F 3/044 345/174 |
| 2017/0301280 A1* | 10/2017 | Ka | G09G 3/2092 |
| 2018/0129111 A1* | 5/2018 | Wu | G02F 1/13338 |
| 2019/0181213 A1* | 6/2019 | Lim | H01L 27/3246 |
| 2019/0281222 A1* | 9/2019 | Yamazaki | G03B 15/05 |

* cited by examiner

ARRAY SUBSTRATE, ORGANIC LIGHT EMITTING DISPLAY PANEL AND ORGANIC LIGHT EMITTING DISPLAY DEVICE

CROSS-REFERENCES TO RELATED APPLICATIONS

This application claims priority to Chinese patent application No. CN201711172127.1, filed on Nov. 22, 2017, the disclosure of which is incorporated herein by reference in its entirety.

TECHNICAL FIELD

Embodiments of the present disclosure relate to the field of semiconductor technologies, and, in particular, relate to an array substrate, an organic light emitting display panel and an organic light emitting display device.

BACKGROUND

In recent years, Organic Light-Emitting Diodes (OLEDs) have become a very popular emerging flat panel display product in China and abroad, because OLED displays have the advantages such as self-luminous, wide viewing angle, short reaction time, high luminous efficiency, low operating voltage, thin thickness, large size, flexibility, and simple fabrication process. Moreover, OLED displays have the potential of low cost.

OLEDs can be divided into two categories according to their driving modes: passive driving OLEDs and active driving OLEDs, also known as direct addressing OLEDs and thin film transistor (TFT) matrix addressing OLEDs. Active driving OLEDs are also known as active matrix (AMOLEDs) types. Each light-emitting unit in an AMOLED has a TFT for independent addressing control. A display pixel composed of a light-emitting unit and a TFT addressing circuit needs a power signal wire which applies a direct current signal to drive the pixel.

However, in a large-size AMOLED display device, since the backplane power signal line has a certain resistance R and the drive currents I of these pixels are provided by the power signal, the power voltage received by a region close to the supply position of the power signal is higher than the power voltage received by a region a distance away from the supply position of the power signal. This phenomenon is referred to as IR drop. IR Drop will cause current differences in different regions, affecting the display effect of the device display.

SUMMARY

In view of this, embodiments of the present disclosure provide an array substrate, a display panel and a display device so as to a technical issue of poor display effect caused by IR drop on the power signal line in the related art.

According to a first aspect, embodiments of the present disclosure provide an array substrate. The array substrate includes: a display region and a non-display region surrounding the display region; a base substrate; a plurality of scan lines and a plurality of data lines; a first electrode wire and a second electrode wire; and a first metal wire and a second metal wire.

The plurality of scan lines and the plurality of data lines are formed on a side of the base substrate. The plurality of scan lines are insulated from the plurality of data lines, the plurality of scan lines intersect the plurality of data lines to form a plurality of pixel units. Each of the plurality of pixel units includes a driving circuit layer and an organic light-emitting device layer which are successively formed on the base substrate, and the organic light-emitting device layer includes an anode layer and a cathode layer.

The first electrode wire and the second electrode wire are formed at the side of the base substrate. The first electrode wire is configured to provide a first supply voltage signal for the anode layer, and the second electrode wire is configured to provide a second supply voltage signal for the cathode layer. The first electrode wire includes a first part in the display region and a second part extending into the non-display region. The second electrode wire is formed in the non-display region and surrounds the display region.

The first metal wire and the second metal wire are formed in the non-display region and surround the display region. The first metal wire and the second metal wire are electrically insulated from each other, the first metal wire is at a side of the second metal wire close to the display region, the first metal wire is electrically connected to the second part of the first electrode wire, and the second metal wire is electrically connected to the second electrode wire.

According to a second aspect, embodiments of the present disclosure provide a display panel including the array substrate in the first aspect.

According to a third aspect, embodiments of the present disclosure provide a display device including the display panel in the second aspect.

According to the array substrate, display panel and display device provided by embodiments of the present disclosure, the first electrode wire and the second electrode wire are formed at a side of the base substrate, the first electrode wire is configured to provide the first supply voltage signal for the anode layer, and the second electrode wire is configured to provide the second supply voltage signal for the cathode layer, the first metal wire and the second metal wire which are electrically insulated from each other are formed in a part of the non-display region surrounding the display region, the first metal wire is at the side of the second metal wire close to the display region, the first metal wire is electrically connected to the first electrode wire, and the second metal wire is electrically connected to the second electrode wire, thereby reducing IR drops of supply voltage signals on the first electrode wire and the second electrode wire and improving the display effect. Moreover, the metal wire which is separately arranged in the related art is divided to the first metal wire and second metal wire, such that the stress on the first metal wiring and the second metal wiring can be also reduced, thereby improving the encapsulation effect of the display panel.

BRIEF DESCRIPTION OF DRAWINGS

To describe the technical solutions in the exemplary embodiments of the present disclosure more clearly, accompanying drawings for describing the embodiments are briefly described. Apparently, these accompanying drawings are only the accompanying drawings of a part of embodiments to be described rather than all accompanying drawings. Those of ordinary skill in the art can derive other drawings from these accompanying drawings without creative efforts.

DETAILED DESCRIPTION

To make the objectives, technical solutions, and advantages of the present disclosure clearer, the technical solutions of the present disclosure will be fully described below through specific embodiments with reference to the accompanying drawings in the embodiments. Apparently, the described embodiments are merely some but not all embodiments of the present disclosure. All other embodiments obtained by persons of ordinary skill in the art based on the embodiments of the present disclosure without creative efforts will fall within the protection scope of the present disclosure.

Figure 1:
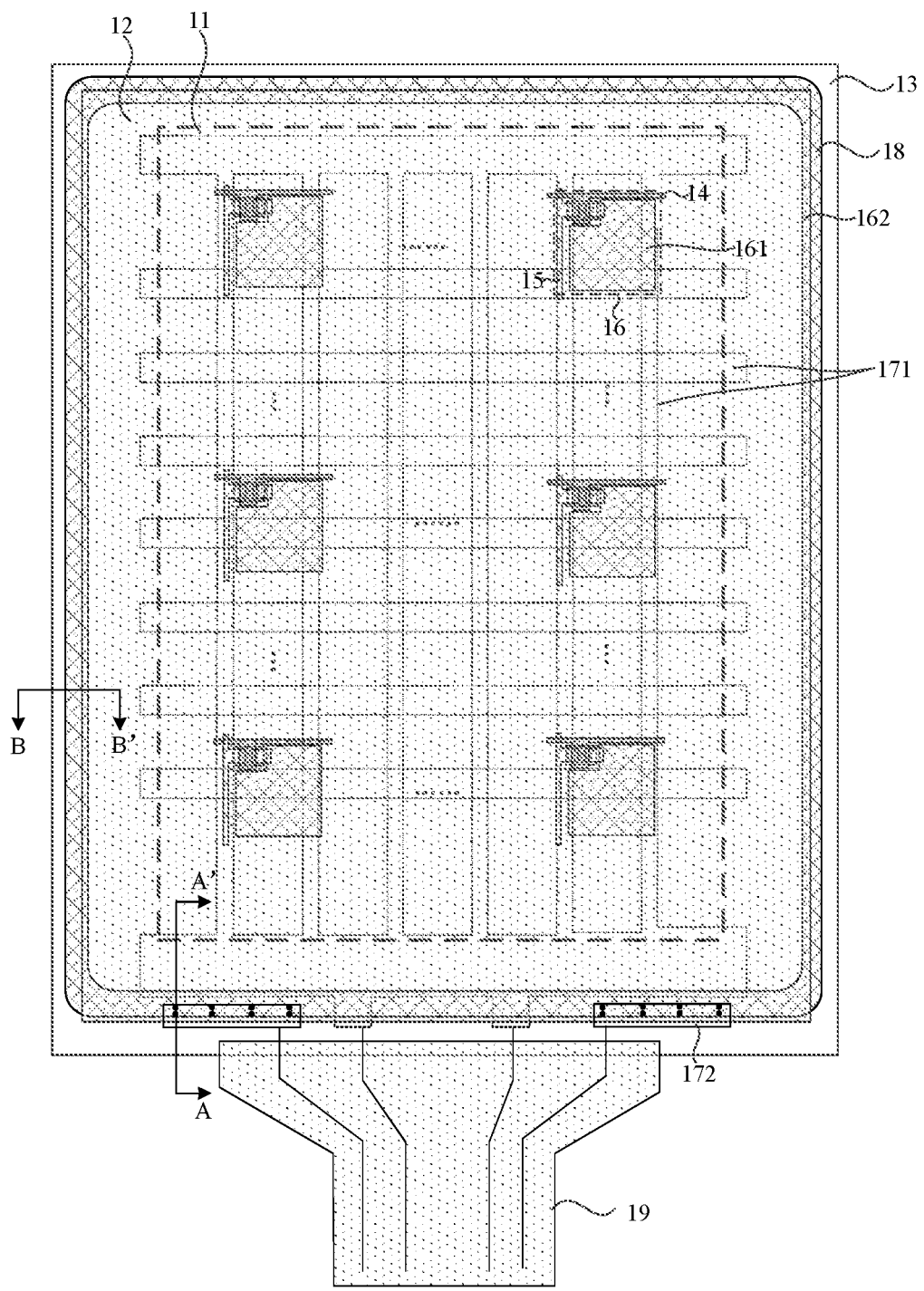
FIG. 1 is a schematic top view of an array substrate in the prior art.
Figure 2:
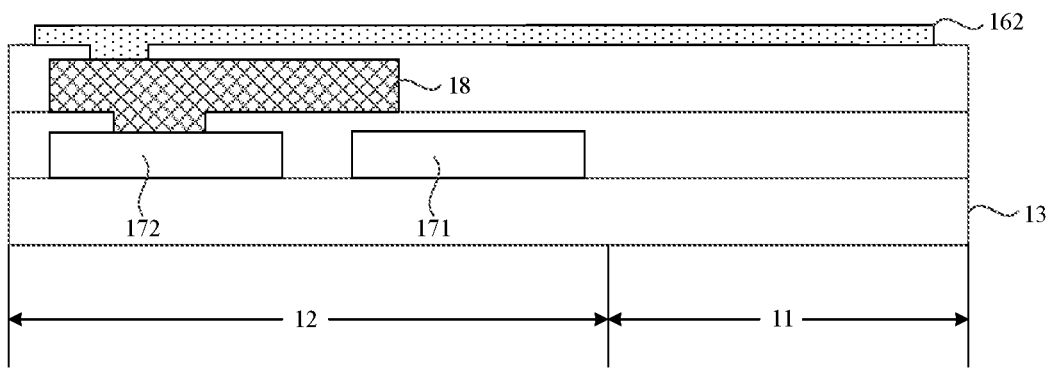
FIG. 2 is a schematic cross-sectional view of the array substrate shown in FIG. 1 taken along a cross section line A-A'.
Figure 3:
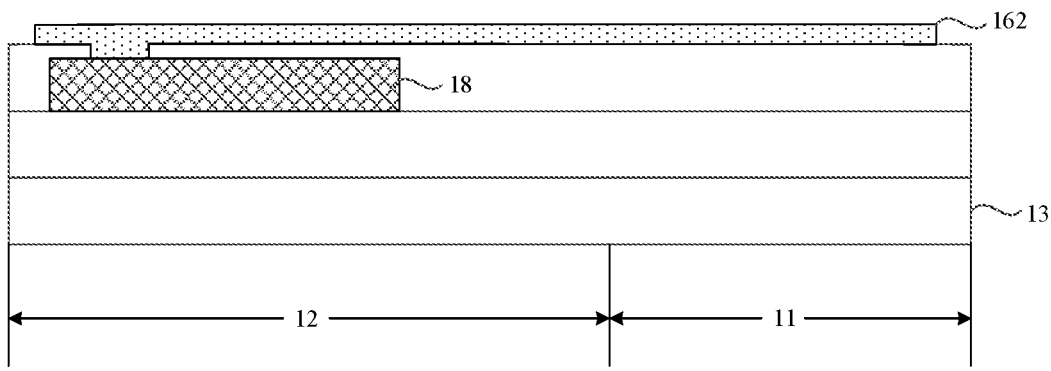
FIG. 3 is a schematic cross-sectional view of the array substrate shown in FIG. 1 taken along a cross section line B-B'.

FIG. 1 is a schematic top view of an array substrate in the prior art. FIG. 2 is a schematic cross-sectional view of the array substrate shown in FIG. 1 taken along a section line A-A'. FIG. 3 is a schematic cross-sectional view of the array substrate shown in FIG. 1 taken along a section line B-B'. As shown in FIG. 1, FIG. 2 and FIG. 3, the array substrate may include a display area 11 and a non-display area 12 surrounding the display area 11.

The array substrate further includes: a base substrate 13, a plurality of scan lines 14 and a plurality of data lines 15; a first electrode wire 171 and a second electrode wire 172; and a metal wire 18.

The plurality of scan lines 14 and the plurality of data lines 15 are formed at a side of the base substrate 13. The plurality of scan lines 14 are insulated from the plurality of data lines 15. The plurality of scan lines 14 intersect the plurality of data lines 15 to form a plurality of pixel units 16. Each of the plurality of pixel units 16 includes an anode layer 161 and a cathode layer 162. FIG. 1 illustrates the cathode layer 162 as an entire plane electrode as an example.

The first electrode wire 171 and the second electrode wire 172 are formed at the side of the base substrate 13. Both of the first electrode wire 171 and the second electrode wire 172 are electrically connected to a flexible printed circuit (FPC) board 19 in the non-display region 12. The first electrode wire 171 receives a first supply voltage signal provided by the FPC 19, and the second electrode wire 172 receives a second supply voltage signal provided by the FPC 19. The first electrode wire 171 is configured to provide the first supply voltage signal for the anode layer 161, and the second electrode wire 172 is configured to provide the second supply voltage signal for the cathode layer 162.

The metal wire 18 is formed in the non-display region 12 and surrounds the display region 11. The metal wire 18 is electrically connected to the cathode layer 162 through a via. The metal wire 18 is electrically connected to the second electrode wire 172 at a lower edge of the array substrate through another via, and is configured to transmit the second supply voltage signal on the second electrode wire 172 to the cathode layer 162.

As shown in FIG. 1, in the related art, in order to reduce the influence of the IR drop caused by the first electrode wire 171, the first electrode wire 171 generally has a uniform mesh design for increasing the connection relationship between the pixels and evenly sharing resistances and currents. In this way, each pixel unit 16 receives a same or similar first voltage signal. With continued reference to FIG. 1, the second electrode wire 172 is only at the side of the non-display area 12 close to the FPC 19. The second electrode wire 172 is electrically connected to the metal wire 18 at the lower edge of the array substrate, and supply the second supply voltage signal to the cathode layer 162 through the metal wire 18.

It should be noted that, both the first supply voltage signal and the second supply voltage signal are provided by the FPC 19 in the non-display region 12, so even the first electrode wire 171 is designed to have the mesh structure, there is still a big difference between the first supply voltage signals received by pixel units 16 in the display region 11 where the pixel units 16 have different distances from the FPC 19, causing IR drop and affecting the display uniformity of the display panel. Likewise, the metal wire 18 is electrically connected to the second electrode wire 172 only through the via at the lower edge of the array substrate, so the second supply voltage signal on the metal wire 18 also has a large IR drop, and the loss of the second supply voltage signal on the metal wire 18 is large, affecting the display effect of the display panel.

Based on the above technical problem, embodiments of the present disclosure provide an array substrate including a display region and a non-display region surrounding the display region. The array substrate further includes: a base substrate; a plurality of scan lines and a plurality of data lines; a first electrode wire and a second electrode wire; and a first metal wire and a second metal wire. The plurality of scan lines and the plurality of data lines are formed at a side of the base substrate. The plurality of scan lines are insulated from the plurality of data lines, the plurality of scan lines intersect the plurality of data lines to form a plurality of pixel units. Each of the plurality of pixel units includes a driving circuit layer and an organic light-emitting device layer which are successively formed on the base substrate, and the organic light-emitting device layer includes an anode layer and a cathode layer. The first electrode wire and the second electrode wire are formed at the side of the base substrate. The first electrode wire is configured to provide a first supply voltage signal for the anode layer, and the second electrode wire is configured to provide a second supply voltage signal for the cathode layer. The first electrode wire includes a first part in the display region and a second part extending into the non-display region. The second electrode wire is formed in the non-display region and surrounds the display region. The first metal wire and the second metal wire are formed in the non-display region and surround the display region. The first metal wire and the second metal wire are electrically insulated from each other, the first metal wire is at a side of the second metal wire close to the display region, the first metal wire is electrically connected to the second part of the first electrode wire, and the second metal wire is electrically connected to the second electrode wire. By the electrical connection of the first metal wire and the second part of the first electrode wire and the electrical connection of the second metal wire and the second electrode wire, the resistance of the transmission wire of the first supply voltage signal and the resistance of the transmission wire of the second supply voltage signal are both reduced, thereby reducing the IR drop of the first supply voltage signal on its transmission wire and the IR drop of the second supply voltage signal on its transmission wire and improving the display effect of the display panel. Moreover, the metal wire which is separately arranged in the related arts is divided to the first metal wire and second metal wire, such that the stress on the first metal wiring and the second metal wiring can be also reduced, thereby improving the encapsulation effect of the display panel.

The technical solutions in embodiments of the present disclosure will be described clearly and completely below with reference to the accompanying drawings in the embodiments. All other embodiments obtained by persons of ordinary skill in the art based on the embodiments of the present disclosure without creative efforts will fall within the protection scope of the present disclosure.

Figure 4:
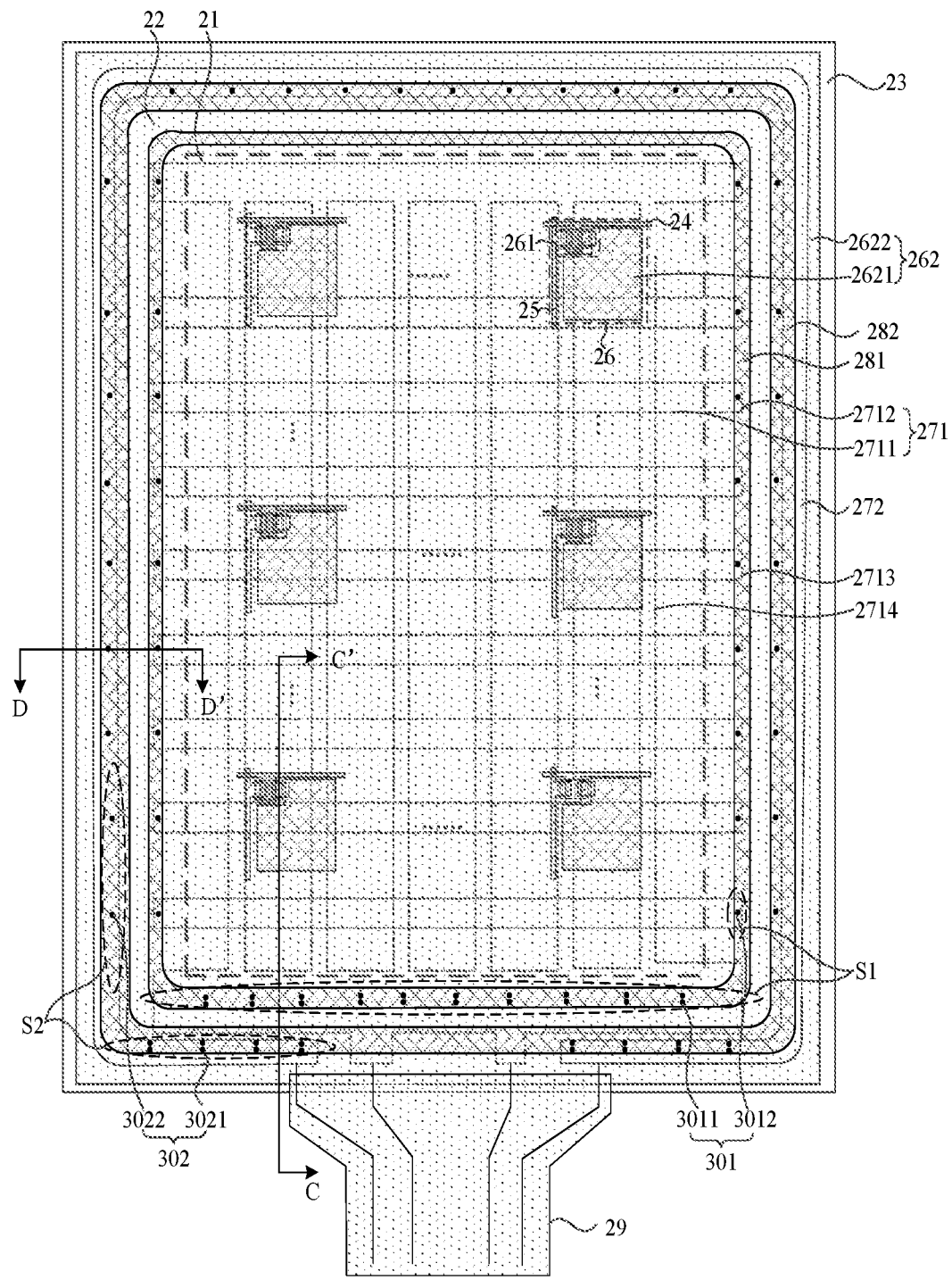
FIG. 4 is a schematic top view of an array substrate according to an embodiment of the present disclosure.
Figure 5:
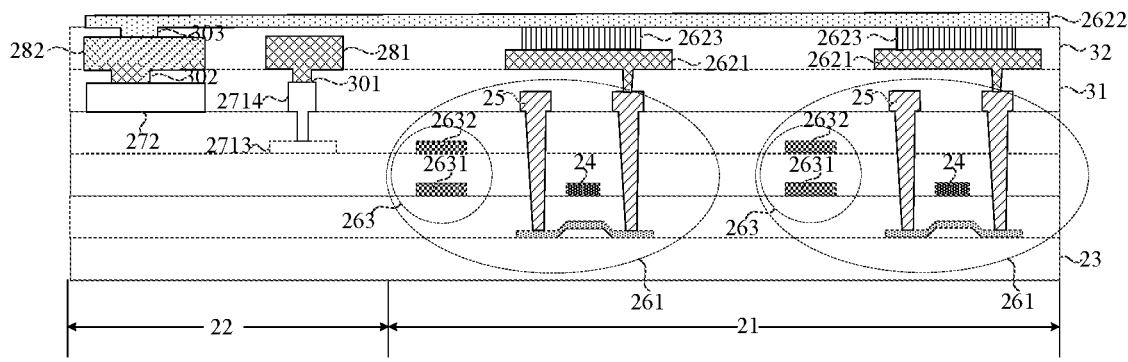
FIG. 5 is a schematic cross-sectional view of the array substrate shown in FIG. 4 taken along a cross section line C-C'.
Figure 6:
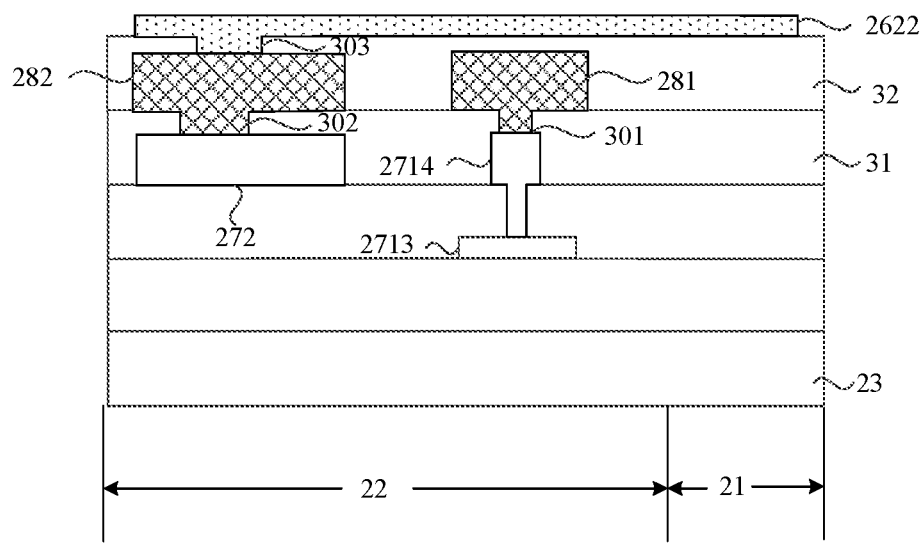
FIG. 6 is a schematic cross-sectional view of the array substrate shown in FIG. 4 taken along a cross section line D-D'.

FIG. 4 is a schematic top view of an array substrate according to an embodiment of the present disclosure. FIG. 5 is a schematic cross-sectional view of the array substrate shown in FIG. 4 taken along a cross section line C-C'. FIG. 6 is a schematic cross-sectional view of the array substrate shown in FIG. 4 taken along a cross section line D-D'. With reference to FIG. 4, FIG. 5 and FIG. 6, the array substrate provided by embodiments of the present disclosure may include a display region 21 and a non-display region 22 surrounding the display region 21.

The array substrate further includes: a base substrate 23; a plurality of scan lines 24 and a plurality of data lines 25; a first electrode wire 271 and a second electrode wire 272; and a first metal wire 281 and a second metal wire 282.

The plurality of scan lines 24 and the plurality of data lines 25 are formed at a side of the base substrate 23. The plurality of scan lines 24 are insulated from the plurality of data lines 25, and the plurality of scan lines 24 intersect the plurality of data lines 25 to form a plurality of pixel units 26. Each of the plurality of pixel units 26 includes a driving circuit layer 261 and an organic light-emitting device layer 262 which are successively formed on the base substrate 23. The organic light-emitting device layer 262 includes an anode layer 2621, a cathode layer 2622 and an organic light-emitting layer 2623.

The first electrode wire 271 and the second electrode wire 272 are formed at the side of the base substrate 23. The first electrode wire 271 is configured to provide a first supply voltage signal for the anode layer 2621. The second electrode wire 272 is configured to provide a second supply voltage signal for the cathode layer 2622. The first electrode wire 271 includes a first part 2711 in the display region 21 and a second part 2712 extending into the non-display region 22. The second electrode wire 272 is formed in the non-display region 22 and surrounds the display region 21.

The first metal wire 281 and the second metal wire 282 are formed in the non-display region 22 and surround the display region 21. The first metal wire 281 and the second metal wire 282 are electrically insulated from each other. The first metal wire 281 is at a side of the second metal wire 282 close to the display region 21. The first metal wire 281 is electrically connected to the second part 2712 of the first electrode wire 271, and the second metal wire 282 is electrically connected to the second electrode wire 272.

Optionally, the array substrate may further include an FPC 29 (not shown) in the non-display region 22. The first electrode wire 271 and the second electrode wire 272 are electrically connected to the FPC 29. The first electrode wire 271 is configured to receive the first supply voltage signal provided by the FPC 29, and the second electrode wire 272 is configured to receive the second supply voltage signal provided by the FPC 29. Optionally, the first supply voltage signal is an anode voltage signal PVDD, and the second supply voltage signal is a cathode voltage signal PVEE.

With continued reference to FIG. 4, the first electrode wire 271 includes a first part 2711 in the display region 21 and a second part 2712 extending into the non-display region 22. The first metal wire 281 which is formed in the non-display region 22 and surrounds the display region 21 is electrically connected to the second part 2712 of the first electrode wire 271. By the electrical connection of the first metal wire 281 and the first electrode wire 271, the area of the transmission wire for conveying the first supply voltage signal is increased, thereby reducing the resistance of the transmission wire for conveying the first supply voltage signal and reducing the IR drop of the first supply voltage signal on the transmission wire. In addition, the first metal wire 281 is arranged in the non-display region 22, and do not occupy the display region 21, thereby not affecting the aperture ratio of the display panel.

With continued reference to FIG. 4, the second electrode wire 272 is formed in the non-display region 22 and surrounds the display region 21, the second metal wire 282 is also formed in the non-display region 22 and surrounds the display region 21, and the second metal wire 282 is electrically connected to the second electrode wire 272, so the area of the transmission wire for conveying the second supply voltage signal is increased, thereby reducing the resistance of the transmission wire for conveying the second supply voltage signal and reducing the IR drop of the second supply voltage signal on the transmission wire. In addition, both of the second electrode wire 272 and the second metal wire 282 are arranged in the non-display region 22, and do not occupy the display region 21, thereby not affecting the aperture ratio of the display panel.

It should be noted that, compared with the related art in which only one metal wire disposed in the non-display area 22 is used for transmitting the supply voltage signal, in the embodiment of the present disclosure, the first metal wire 281 and the second metal wire 282 are disposed, and the first metal wire 281 and the second metal wire 282 are insulated from each other, not only reducing the IR drop of the PVDD signal on its signal transmission wire and the IR drop pf the PVEE signal on its signal transmission wire, but also reducing the stress bear by the first metal wire 281 and the second metal wire 2821 through the insulately arranged first metal wire 281 and the second metal wire 2821, thereby ensuring that the first metal wire 281 and the second metal wire 2821 will not break and improving the overall encapsulation effect of the array substrate.

Optionally, with continued to reference to FIG. 5, the first metal wire 281 and the second metal wire 282 are arranged at a same layer, and the first metal wire 281 and the second metal wire 282 may be arranged at a same layer as the anode layer 2621. During the fabrication, the first metal wire 281 and the second metal wire 282 may be fabricated by a same process with the anode layer 2621 without any additional fabrication process or mask, ensuring the fabrication process of the first metal wire 281 and the second metal wire 282 simple.

Optionally, in order to solve the problem of IR drop caused by the first electrode wire 271, the first electrode wire 271 adopts a uniform mesh design to increase the connection relationship between pixels, and the resistance and the current are equally allocated. With continued reference to FIG. 4, the first electrode wire 271 includes a plurality of first sub-electrode-wires 2713 arranged in an extending direction of the plurality of scan lines 24 and a plurality of second sub-electrode-wires 2714 arranged in an extending direction of the plurality of data lines 25. The plurality of first sub-electrode-wires 2713 intersect the plurality of second sub-electrode-wires 2714, and are electrically connected to the plurality of second sub-electrode-wires 2714. Optionally, the first metal wire 281 may be electrically connected to the plurality of first sub-electrode-wires 2713; and/or the first metal wire 282 may be electrically connected to the plurality of second sub-electrode-wires 2714. FIG. 4 merely illustrates an example in which the first metal wire 281 is electrically connected to the first sub-electrode wires 2713 and the second sub-electrode wires 2714, respectively. As shown in FIG. 4, the first metal wire 281 is electrically connected to the first sub-electrode-wires 2713 near two side edges of the array substrate; and the first metal wire 281 is electrically connected to the second sub-electrode-wires 2714 near the lower edge of the array substrate.

With continued reference to FIG. 4, in a direction perpendicular to the base substrate 21, a first region S1 between the first metal wire 281 and the second part 2712 of the first electrode wire 271 is provided (the first metal wire 281 overlaps the second part 2712 of the first electrode wire 271 in the first region S1), and a plurality of first vias 301 are formed in the first region S1. The first metal wire 281 is electrically connected to the first electrode wire 271 through the plurality of first vias 301. In the direction perpendicular to the base substrate 21, a second region S2 between the second metal wire and the second electrode wire is provided (the second metal wire overlaps the second electrode wire), and a plurality of second vias 302 are formed in the second region S2. The second metal wire 282 is electrically connected to the second electrode wire 272 through the plurality of second vias 302.

Exemplarily, the first metal wire 281 is electrically connected to the first electrode wire 271 through the plurality of first vias 301, ensuring a large contact area between the first metal wire 281 and the first electrode wire 271, which not only reduces the resistance of the transmission wire conveying the first supply voltage signal, but also ensures that positions with different distances from the FPC 29 have the same or similar voltage drop of the first supply voltage signal, thereby reducing the IR drop of the first supply voltage signal and improving the display uniformity. Likewise, the second metal wire 282 is electrically connected to the second electrode wire 272 through the plurality of second vias 302, ensuring a large contact area between the second metal wire 282 and the second electrode wire 272, which not only reduces the resistance of the transmission wire conveying the second supply voltage signal, but also ensures that different positions with respect to the FPC 29 have the same or similar voltage drop of the second supply voltage signal, thereby reducing the IR drop of the second supply voltage signal and improving the display uniformity.

Specifically, with continued reference to FIG. 4, the plurality of first vias 301 may include a plurality of first type vias 3011 arranged in the extending direction of the plurality of scan lines 24 and a plurality of second type vias 3012 arranged in the extending direction of the plurality of data lines 25, the first metal wire 281 is electrically connected to the plurality of first sub-electrode wires 2713 through the plurality of second type vias 3012, and the first metal wire 281 is electrically connected to the plurality of second sub-electrode wires 2714 through the plurality of first type vias 3011. Further, the plurality of second vias 302 may include a plurality of third type vias 3021 arranged in the extending direction of the plurality of scan lines 24 and a plurality of fourth type vias 3022 arranged in the extending direction of the plurality of data lines 25, and the second metal wire 282 is electrically connected to the second electrode wire 272 through the plurality of third type vias 3021 and the plurality of fourth type vias 3022.

Optionally, since the plurality of first sub-electrode wires 2713 are arranged in the extending direction of the scan lines 24, each of the plurality of first sub-electrode wires 2713 may be arranged to correspond to a respective one of the plurality of scan lines 24. In this way, the arrangement of the plurality of first sub-electrode wires 2713 will not affect the aperture ratio of the display panel. Each of the plurality of first sub-electrode wires 2713 corresponds to a respective one of the plurality of scan lines 24, each of the plurality of scan lines 24 corresponds to a row of pixel units 26, and the first metal wire 281 is electrically connected to the plurality of first sub-electrode wires 2713 through the plurality of second type vias 3012, so in the actual design process, each of the second type of vias 3012 may correspond to a respective row of pixel units 26.

Optionally, with continued reference to FIG. 5, the driving circuit layer 261 provided by embodiments of the present disclosure may further include a storage capacitor 263. The storage capacitor 263 includes a first plate 2631 and a second plate 2632. In one or more embodiments, the first sub-electrode-wires 2713 may be arranged at a same layer as the scan lines 24. In one or more embodiments, alternatively, the first sub-electrode wires 2713 may be arranged at a same layer as the first plate 2631 or the second plate 2632. In one or more embodiments, the second sub-electrode-wires 2714 may be arranged at a same layer as the data lines 25. FIG. 5 merely exemplarily illustrates a configuration in which the first sub-electrode-wires 2713 is arranged at a same layer as the second plate 2632 as an example. By configuring the first sub-electrode-wires 2713 at the same layer as the scan lines 24, or the first plate 2631, or the second plate 2632 and configuring the second sub-electrode-wires 2714 at the same layer as the data lines 25, it is ensured that, the first sub-electrode-wires 2713 are fabricated in the same fabrication process step with the scan lines 24, or the first plate 2631, or the second plate 2632 during fabrication, and the second sub-electrode-wires 2714 are fabricated in the same fabrication process step with the data lines 25 during fabrication, which is compatible with the existing array substrate fabrication process and ensures a simple fabrication process. It should be noted that, since the scan line 24 and a gate electrode in the driving circuit layer 261 are arranged at the same layer and connected to each other, the scan line 24 is represented by the gate electrode in FIG. 5. Similarly, since the data line 25 and a source electrode in the driving circuit layer 261 are arranged at the same layer and connected to each other, the data line 25 is represented by the source electrode in FIG. 5.

Optionally, the second electrode wire 272 may be arranged at a same layer as the data lines 25 (not shown), the second electrode wire 272 and the data lines 25 may be fabricated in a same fabrication process step during fabrication, which is compatible with the existing array substrate fabrication process and ensures a simple fabrication process.

Optionally, with continued reference to FIG. 5, the array substrate provided by embodiments of the present disclosure may further include a planarization layer 31 between the driving circuit layer 261 and the organic light-emitting layer 262. The planarization layer 31 may protect the driving circuit layer 261 underneath the planarization layer 31. Optionally, the planarization layer 31 may be made from organic material including Benzocyclobutene or Acrylic acid or inorganic material including silicon nitride. The planarization layer 31 may be formed as a single layer, a double layer, or multiple layers. Optionally, since the first metal wire 281 and the second metal wire 282 may be arranged at a same layer as the anode layer 2621, the first vias 301 by which the first metal wire 281 and the first electrode wire 272 are connected may be formed in the planarization layer 31. Similarly, the second vias 302 by which the second metal wire 282 and the second electrode wire 272 are connected may also be formed in the planarization layer 31. The configuration in which the first vias 301 and the second vias 302 are formed in the planarization layer 31 ensures that the fabrication of the first vias 301 and the second vias 302 is simple and is compatible with the existing array substrate fabrication process.

Optionally, with continued reference to FIG. 5, the array substrate provided by embodiments of the present disclosure may further include a pixel definition layer 32 between the anode layer 2621 and the cathode layer 2622. The pixel definition layer 32 is located between two adjacent pixel units 16, and can prevent or reduce mixing of colors of adjacent pixel units. Optionally, the material of the pixel definition layer 32 may include one or more organic insulation materials such as Polyimides, Polyamide resin, Acrylic resin, Benzocyclobutene and phenolic resin. The material of the pixel definition layer 32 may further include one or more inorganic insulation materials such as $SiO_2$, $SiN_x$, $Al_2O_3$, $CuO_x$, $Tb_4O_7$, $Y_2O_3$, $Nb_2O_5$ and $Pr_2O_3$. In addition, the pixel definition layer 32 may also have a multi-layer structure in which organic insulation materials and inorganic insulation materials are alternately arranged. A cathode contacting hole 303 is formed at the pixel definition layer 32. The cathode layer 2622 and the second metal wire 282 are electrically connected to each other through the cathode contacting hole 303. By forming the cathode contacting hole 303 at the pixel definition layer 32 and electrically connecting the cathode layer 2622 and the second metal wire 282 through the cathode contacting hole 303, it is ensured that the formation of the cathode contacting hole 303 is simple and is compatible with the existing array substrate fabrication process.

Figure 7:
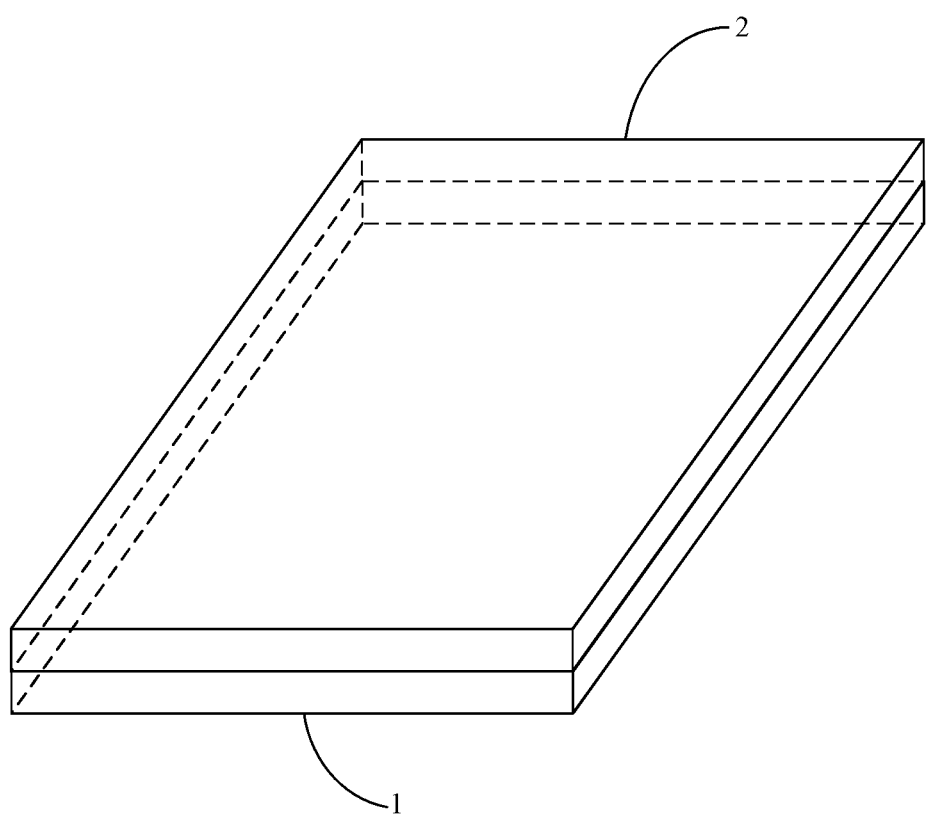
FIG. 7 is a schematic perspective view of a display panel according to an embodiment of the present disclosure.

FIG. 7 is a schematic structural view of a display panel according to an embodiment of the present disclosure. As shown in FIG. 7, the display panel provided by embodiments of the present disclosure includes the array substrate 1 in the above embodiments and a counter substrate 2 opposite to the array substrate 1. The counter substrate 2 may be a cover plate or other encapsulation layer.

Figure 8:
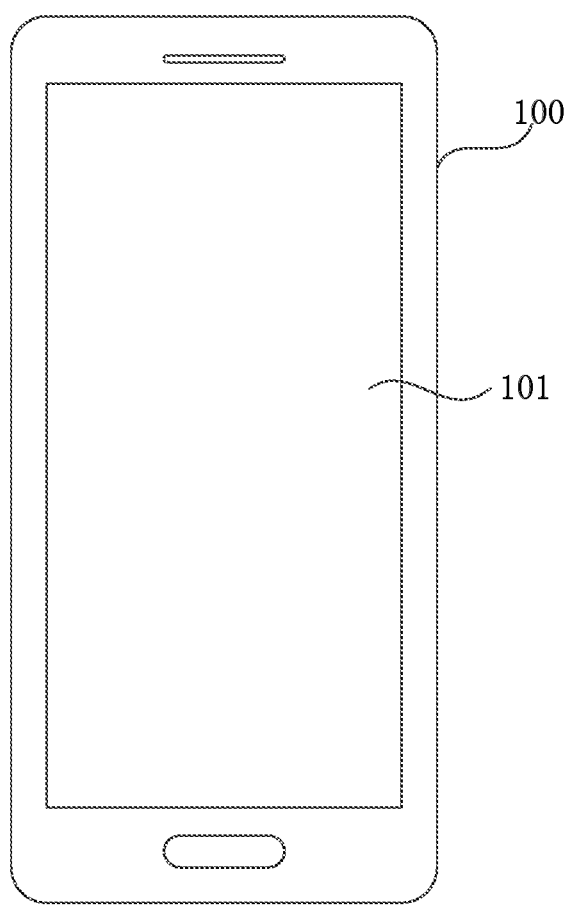
FIG. 8 is a schematic top view of a display device according to an embodiment of the present disclosure.

FIG. 8 is a schematic structural view of a display device according to an embodiment of the present disclosure. As shown in FIG. 8, the display device 100 may include the display panel 101 in any embodiment of the present disclosure. The display device 100 may be a phone shown in FIG. 8, or may be a computer, a television, a smart wearable display device, and the like, which is not specifically limited in embodiments of the present disclosure.

It should be noted that the above is only the optional embodiments of the present disclosure and the applied technical principles. Those skilled in the art should understand that the present disclosure is not limited to the specific embodiments described herein, and various apparent modification, readjustments, combinations and substitutions can be made by those skilled in the art without departing from the scope of the present disclosure. Therefore, although the present disclosure has been described in detail by way of the above embodiments, the present disclosure is not limited only to the above embodiments, and may include more other equivalent embodiments without departing from the concept of the present disclosure. However, the scope of the present disclosure is determined by the scope of the appended claims.

What is claimed is:

1. An array substrate, comprising:
   a display region and a non-display region surrounding the display region;
   a base substrate;
   a plurality of scan lines and a plurality of data lines, formed on a side of the base substrate, wherein the plurality of scan lines are insulated from the plurality of data lines, the plurality of scan lines intersect the plurality of data lines to form a plurality of pixel units, wherein each of the plurality of pixel units comprises a driving circuit layer and an organic light-emitting device layer which are successively formed on the base substrate, and wherein the organic light-emitting device layer comprises an anode layer and a cathode layer;
   a first electrode wire and a second electrode wire, formed at the side of the base substrate, wherein the first electrode wire is configured to provide a first supply voltage signal for the anode layer, the second electrode wire is configured to provide a second supply voltage signal for the cathode layer, wherein the second electrode wire is formed in the non-display region and surrounds the display region; and
   a first metal wire and a second metal wire, formed in the non-display region and surround the display region, wherein the first metal wire and the second metal wire are electrically insulated from each other, wherein the first metal wire is at a side of the second metal wire close to the display region, wherein the first metal wire is electrically connected to the first electrode wire, and wherein the second metal wire is electrically connected to the second electrode wire.

2. The array substrate according to claim 1, wherein the first metal wire and the second metal wire are arranged in a same layer as the anode layer.

3. The array substrate according to claim 1, wherein the first electrode wire comprises a plurality of first sub-electrode-wires arranged in an extending direction of the plurality of scan lines, and a plurality of second sub-electrode-wires arranged in an extending direction of the plurality of data lines;
   wherein each sub-electrode-wire of the plurality of first sub-electrode-wires and the plurality of second sub-electrode-wires comprises a first part in the display region and a second part extending into the non-display region; and
   wherein the first metal wire is electrically connected to the second parts of the plurality of the first sub-electrode wires; and
   wherein the plurality of first sub-electrode-wires intersect the plurality of second sub-electrode-wires.

4. The array substrate according to claim 3, wherein the first metal wire is electrically connected to the plurality of first sub-electrode-wires.

5. The array substrate according to claim 3, wherein the first metal wire is electrically connected to the plurality of second sub-electrode-wires.

6. The array substrate according to claim 3, wherein the first metal wire is electrically connected to the plurality of first sub-electrode-wires and the plurality of second sub-electrode-wires.

7. The array substrate according to claim 4, wherein, the first metal wire overlays the second parts of the plurality of first sub-electrode wires in a first region, and the second metal wire overlays the second electrode wire in a second region.

8. The array substrate according to claim 7, wherein the first metal wire is electrically connected to the first electrode wire through a plurality of first vias in the first region, and the second metal wire is electrically connected to the second electrode wire through a plurality of second vias in the second region.

9. The array substrate according to claim 8, wherein the plurality of first vias comprise a plurality of first type vias arranged in the extending direction of the plurality of scan lines, and a plurality of second type vias arranged in the extending direction of the plurality of data lines, wherein the first metal wire is electrically connected to the plurality of first sub-electrode wires through the plurality of second type vias, and the first metal wire is electrically connected to the plurality of second sub-electrode-wires through the plurality of first type vias;

wherein the plurality of second vias comprise a plurality of third type vias arranged in the extending direction of the plurality of scan lines and a plurality of fourth type vias arranged in the extending direction of the plurality of data lines; and wherein the second metal wire is electrically connected to the second electrode wire through the plurality of third type vias and the plurality of fourth type vias.

10. The array substrate according to claim 9, wherein each of the plurality of second type vias is arranged to correspond to a respective row of pixel units.

11. The array substrate according to claim 3, wherein the driving circuit layer further comprises a storage capacitor having a first plate and a second plate, wherein the plurality of first sub-electrode-wires are arranged in a same layer as the plurality of scan lines; and wherein the plurality of second sub-electrode-wires are arranged in a same layer as the plurality of data lines.

12. The array substrate according to claim 3, wherein the driving circuit layer further comprises a storage capacitor having a first plate and a second plate, wherein the plurality of first sub-electrode-wires are arranged in a same layer as the first plate of the storage capacitor; and wherein the plurality of second sub-electrode-wires are arranged in a same layer as the plurality of data lines.

13. The array substrate according to claim 1, wherein the second electrode wire is arranged in a same layer as the plurality of data lines.

14. The array substrate according to claim 8, further comprising a planarization layer between the driving circuit layer and the organic light-emitting layer, wherein the plurality of first vias and the plurality of second vias are formed in the planarization layer.

15. The array substrate according to claim 1, further comprising a pixel definition layer between the anode layer and the cathode layer, wherein the pixel definition layer is provided with a cathode contacting hole, and wherein the cathode layer is electrically connected to the second metal wire through the cathode contacting hole.

16. A display panel, comprising: an array substrate, wherein the array substrate comprises:

a display region and a non-display region surrounding the display region;

a base substrate;

a plurality of scan lines and a plurality of data lines, formed on a side of the base substrate, wherein the plurality of scan lines are insulated from the plurality of data lines, the plurality of scan lines intersect the plurality of data lines to form a plurality of pixel units, wherein each of the plurality of pixel units comprises a driving circuit layer and an organic light-emitting device layer which are successively formed on the base substrate, and wherein the organic light-emitting device layer comprises an anode layer and a cathode layer;

a first electrode wire and a second electrode wire, formed at the side of the base substrate, wherein the first electrode wire is configured to provide a first supply voltage signal for the anode layer, the second electrode wire is configured to provide a second supply voltage signal for the cathode layer, wherein the second electrode wire is formed in the non-display region and surrounds the display region; and a first metal wire and a second metal wire, formed in the non-display region and surround the display region, wherein the first metal wire and the second metal wire are electrically insulated from each other, wherein the first metal wire is at a side of the second metal wire close to the display region, wherein the first metal wire is electrically connected to the first electrode wire, and wherein the second metal wire is electrically connected to the second electrode wire.

17. A display device, comprising: a display panel, wherein the display panel comprises an array substrate, and wherein the array substrate comprises:

a display region and a non-display region surrounding the display region;

a base substrate;

a plurality of scan lines and a plurality of data lines, formed on a side of the base substrate, wherein the plurality of scan lines are insulated from the plurality of data lines, the plurality of scan lines intersect the plurality of data lines to form a plurality of pixel units, wherein each of the plurality of pixel units comprises a driving circuit layer and an organic light-emitting device layer which are successively formed on the base substrate, and wherein the organic light-emitting device layer comprises an anode layer and a cathode layer;

a first electrode wire and a second electrode wire, formed at the side of the base substrate, wherein the first electrode wire is configured to provide a first supply voltage signal for the anode layer, the second electrode wire is configured to provide a second supply voltage signal for the cathode layer, wherein the second electrode wire is formed in the non-display region and surrounds the display region; and a first metal wire and a second metal wire, formed in the non-display region and surround the display region, wherein the first metal wire and the second metal wire are electrically insulated from each other, wherein the first metal wire is at a side of the second metal wire close to the display region, wherein the first metal wire is electrically connected to the first electrode wire, and wherein the second metal wire is electrically connected to the second electrode wire.

* * * * *